United States Patent [19]

Tsurunaga et al.

[11] Patent Number: 5,021,914
[45] Date of Patent: Jun. 4, 1991

[54] SUPERCONDUCTING SWITCH AND CURRENT LIMITER USING SUCH A SWITCH

[75] Inventors: Kazuyuki Tsurunaga, Mizuho; Yoshihisa Masuda, Fuchu; Hiroyuki Okumura, Shiroyama; Daisuke Ito, Yokohama, all of Japan

[73] Assignee: Kabushiki Kaisha Toshiba, Kawasaki, Japan

[21] Appl. No.: 379,117

[22] Filed: Jul. 13, 1989

[30] Foreign Application Priority Data

Jul. 13, 1988 [JP] Japan .................................. 63-174251
Oct. 7, 1988 [JP] Japan .................................. 63-253315

[51] Int. Cl.⁵ .............................................. H02H 3/08
[52] U.S. Cl. ................................. 361/19; 335/216; 505/850
[58] Field of Search ................ 361/19, 35; 335/216; 336/DIG. 1, 220, 221, 183; 207/415, 140; 505/850, 879, 880

[56] References Cited

U.S. PATENT DOCUMENTS

| | | | |
|---|---|---|---|
| 4,271,585 | 6/1981 | Satti | 335/216 X |
| 4,700,257 | 10/1987 | Bekhaled | 361/19 |
| 4,764,837 | 8/1988 | Jones | 361/19 |
| 4,841,268 | 6/1989 | Burnett et al. | 335/216 |

FOREIGN PATENT DOCUMENTS 48-2038 1/1973 Japan .

Primary Examiner—Derek S. Jennings
Attorney, Agent, or Firm—Foley & Lardner

[57] ABSTRACT

There is disclosed a superconducting switch including two superconducting coils wound on a common bobbin wherein these coils have the same critical current value, and are connected in parallel so that magnetomotive forces which are the same in magnitude and opposite to each other in direction are produced. This superconducting switch is non-inductive and responds to an overcurrent to securely operated at a high speed. There is also disclosed a current limiter including a current limiting coil connected in parallel with the superconducting switch used as a trigger coil. The superconducting switch exists within a magnetic field produced by the current limiting coil. There is further disclosed a current limiter such that the current limiting coil is constructed to be of non-inductive type using two coils, and a superconducting switch is connected to either of these coils.

6 Claims, 8 Drawing Sheets

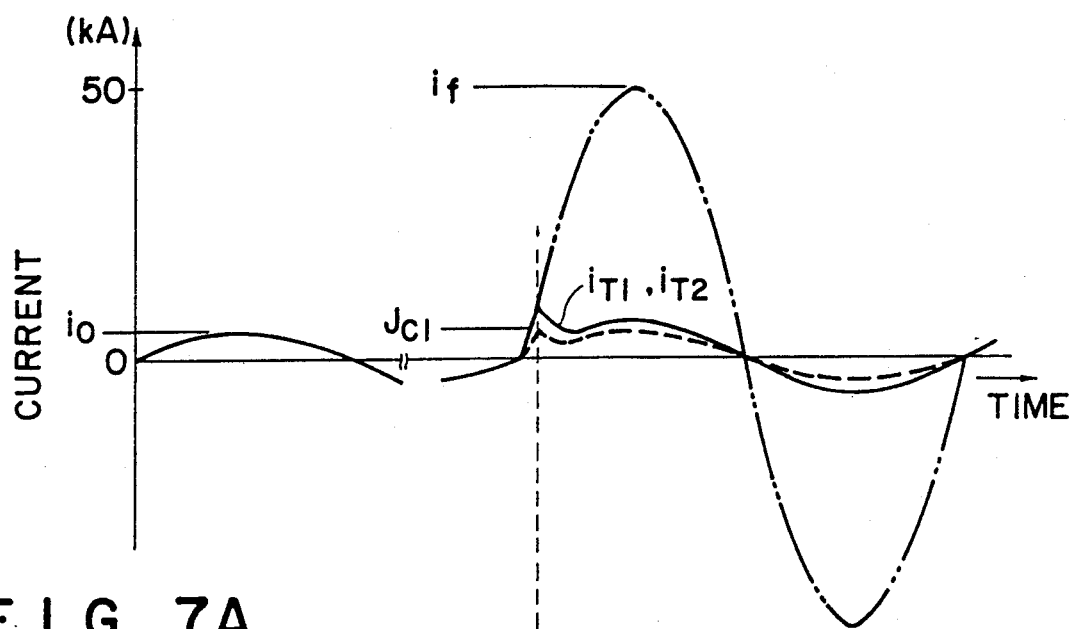
F I G. 7A
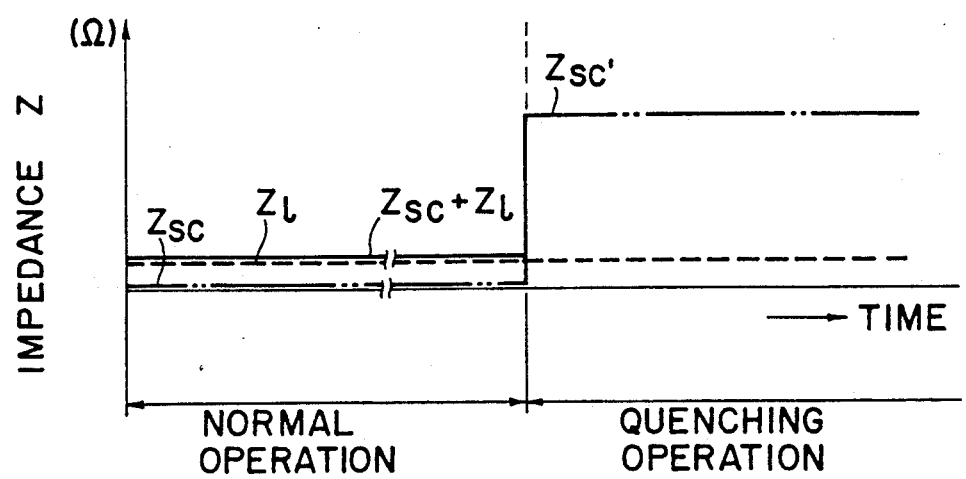
F I G. 7B

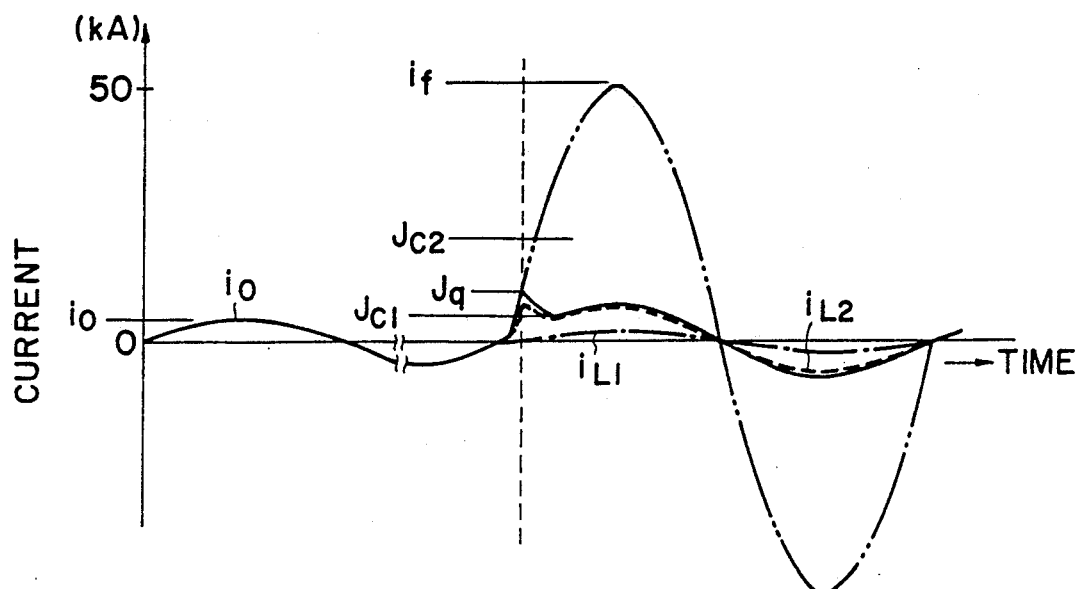
F I G. 18A
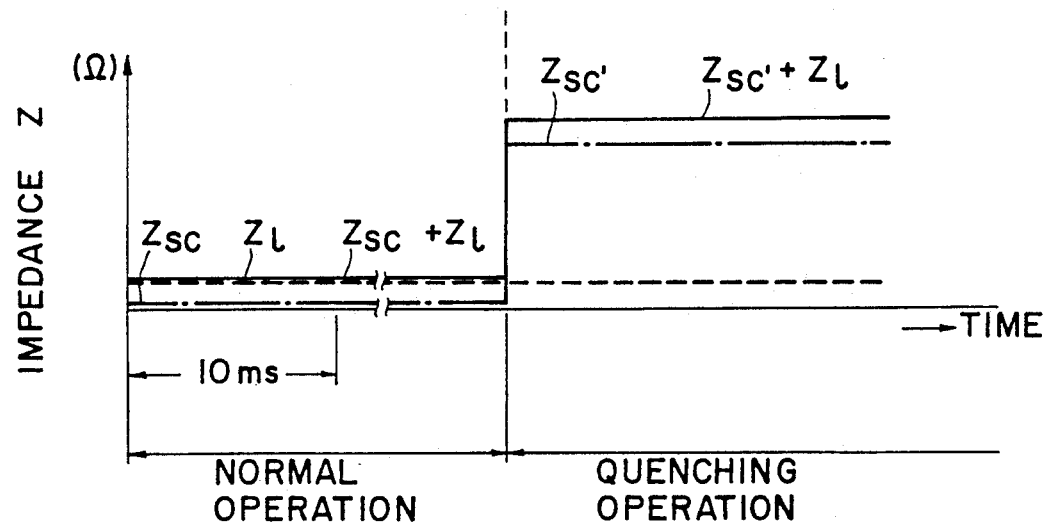
F I G. 18B

SUPERCONDUCTING SWITCH AND CURRENT LIMITER USING SUCH A SWITCH

BACKGROUND OF THE INVENTION

This invention relates to a superconducting switch and a current limiter for electromagnetically limiting an overcurrent in an a.c. electric path using such a superconducting switch.

When an overcurrent flows in electric equipment, it is required for protecting the electric equipment from such an overcurrent to limit flowing of an overcurrent the moment it occurs. For a current limiter for limiting an overcurrent, there is known a current limiter disclosed in, e.g., the Japanese Patent Publication Laid Open No. 74932/85. In this current limiter, two coils are wound on an iron core so that their magnetomotive forces are substantially equal to each other. Respective ends of both coils are connected to an electric path on the side of the power supply so that the directions of their magnetic flux are opposite each other. The other end of the coil on one side is connected to an electric path on and load side through a switch. Furthermore, the other end of the coil on the other side is similarly connected to the electric path on the load side. A current limiting resistor is connected in parallel with the switch. In addition, a current transformer is provided in the electric path. This current transformer serves to trip the switch when it detects an overcurrent.

In this circuit, when an overcurrent flows in the electric path due to short-circuit of the load, the current transformer detects this phenomenon to open the switch to insert the current limiting resistor into the circuit of the coil on one side. Thus, while a current flowing in the coil on one side is decreased, a current flowing in the coil on the other side is increased. As a result, the magnetic flux produced by the coil on the other side wound on the iron core is dominant as compared to that produced by the coil on one side wound thereon. Accordingly, the inductance of the coil on the other side becomes active, i.e., a failure current is limited by the action of reactor.

Since a current of several hundreds to several thousands of amperes exists in an ordinary state in the above-described current limiter, both coils are required to have a large cross section, and they are also required to have an increased number of turns in order to provide a large current limiting impedance. This results in the problems that the current limiter become large-sized, and that a large amount of power loss due to heating cannot be avoided.

Furthermore, the above-described current limiter often uses a mechanical switch, and therefore requires a time of one to three cycles from the time when an overcurrent is detected until the switch is opened to carry out the current limiting operation, resulting in the problem that the electric path is difficult to protect.

For this countermeasure, a semiconductor switch such as a thyristor, etc. may be used. In this case, a power loss is produced by a voltage drop in the forward direction of the thyristor. Consequently, the current limiter further becomes large-sized and complicated, with the result that the employment of such a semiconductor switch was difficult.

For this reason, it has been proposed to use a current limiting body utilizing a superconductor. Namely, a current limiting element made up by forming a superconductive body in the form of a rectangular wave is connected in series with a circuit including a power source, an interrupter, a line impedance, and a load. In the circuit thus constructed, when a current $i_o$ flows in the load via the current limiting body, the current limiting body in a superconducting state. The value of a current flowing in the current limiting body is in a range smaller than a critical current value $J_{cl}$. Assuming now that a critical current $J_{cl}$ flows in the current limiting body, the current limiting body produces quenching to rapidly shift to a normal conducting state. At this time, the resistance of the current limiting body abruptly increases to its intrinsic resistance value. By this high resistance value, a current flowing in the load through the current limiting body is limited. The resistance value R of the current limiting body when quenching is produced in the current limiting body as stated above is expressed as $R = \rho c\,(1/A)$. Namely, the resistance value R of the current limiting body is proportional to product of the intrinsic resistance $\rho c$ ($\mu\Omega$-cm) and the length 1 (cm) of the current limiting body, and is inversely proportional to cross section A (cm$^2$) of the current limiting body.

However, while the critical current density of well known Nb-Ti based superconductor has a very large value of the order of 1 to 3 (KA/cm$^2$), the intrinsic resistance at a normal conducting time has a very small value of the order of 20 to 50 ($\mu\Omega$-cm). Accordingly, only in the case of a superconductor in the form of a rectangular waveform, is the cross section A (cm$^2$) is large as well as the length is not sufficient, so that a sufficiently high resistance value at the time of quenching of the superconductor cannot be obtained. For this reason, a coil-shaped superconductor which is further thinned and elongated may be devised in order to provide a high resistance value. However, since such a coil-shaped superconductor has an inductance, an impedance voltage drop would occur with respect to a steady state current and a high surge voltage at the time of quenching is produced, exerting an adverse influence on the circuit equipment. Furthermore, limiting of current is not definitely carried out by a delay based on the inductive component. In addition, since a high voltage is applied to a superconductor at the time of quenching, there is the problem that the dimension between coils must be large in order to obtain a sufficient withstand voltage.

SUMMARY OF THE INVENTION

An object of this invention is to provide a superconducting switch securely operative at a high speed due to an overcurrent.

Another object of this invention is to provide a current limiter which can be made compact and provide a definite line protection, and which can suppress a power loss due to heating at an extremely low value.

A further object of this invention is to provide a current limiter wherein, at the time of quenching, the current limiter can provide a sufficiently high resistance value so that current can be sufficiently limited, and securely provide limiting of current, and in a normal state, no wasteful power dissipation by inductance is produced.

A still further object of this invention is to provide a current limiter which can reduce the size of a superconducting coil body.

In accordance with a first aspect of this invention, there is provided a superconducting switch provided with two superconducting coils wound on a common cylindrical core means, and connected in parallel so as to have substantially the same critical current value and to produce magnetomotive force opposite to each.

In accordance with this invention, since the respective magnetic flux of both coils cancel with each other and the superconducting switch is non-inductive as a whole, it is possible to ensure a large impedance change corresponding to a change of a current flowing therethrough.

In accordance with a second aspect of this invention, there is provided a current limiter comprising a superconducting coil, and the above-mentioned superconducting switch disposed in a magnetic field of the superconducting coil, and having a critical current value and formed non-inductive.

In accordance with this invention, at the time of a normal operation, a greater part of current flows in the superconducting switch formed non-inductive, and when an overcurrent is produced, it is quenched by the superconducting switch earlier than by the superconducting coil, whereby it is caused to communicate to the side of the superconducting coil.

Accordingly, an overcurrent can be securely limited in an extremely short time.

In accordance with a third aspect of this invention, there is provided a current limiter comprising first and second superconducting coils connected in parallel so as to produce magnetomotive forces opposite to each other, and a superconducting switch having a critical current value smaller than a critical current value of the superconducting coil, the superconducting switch being connected to one of the first and second superconducting coil.

Since the superconducting switch is positioned irrespective of a magnetic field of the superconducting coil in this invention, current limiting operation can be securely carried out without influence of the superconducting coil side.

BRIEF DESCRIPTION OF THE DRAWINGS

In the accompanying drawings:

FIG. 7A is a graph showing current changes at the time of normal operation and at the time of quenching of the superconducting switch according to this invention;

FIG. 7B is a graph showing impedance changes at the time of normal operation and at the time of quenching of the superconducting switch according to this invention;

FIG. 18A is a graph showing current changes at the time of normal operation and at the time of current limiting operation in the second embodiment of the current limiter according to this invention; and FIG. 18B is a graph showing impedance changes at the time of normal operation and at the time of current limiting operation in the second embodiment of the current limiter according to this invention.

DETAILED DESCRIPTION OF THE PREFERRED EMBODIMENTS

Figure 1:
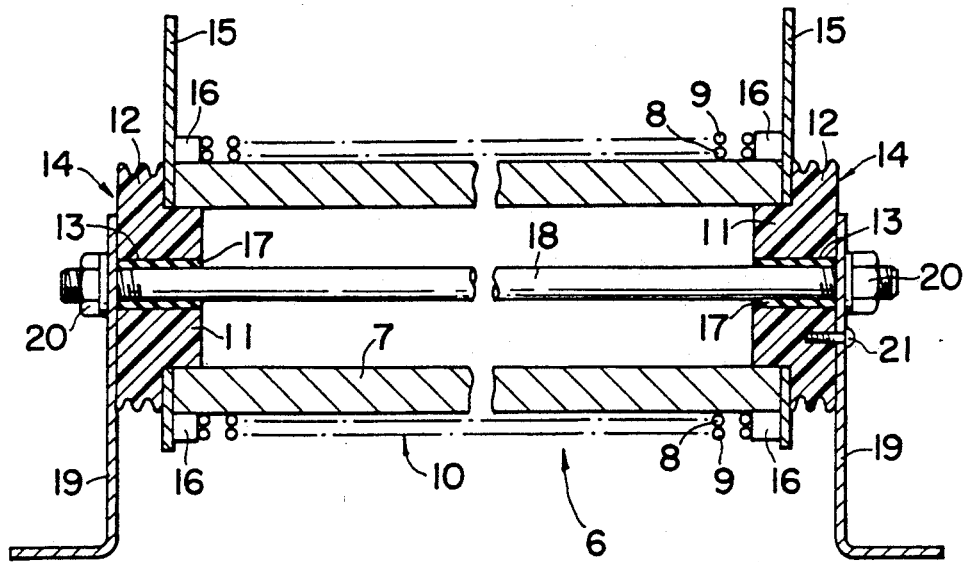
FIG. 1 is a cross sectional view showing the structure of a first embodiment of a superconducting switch according to this invention.
Figure 2:
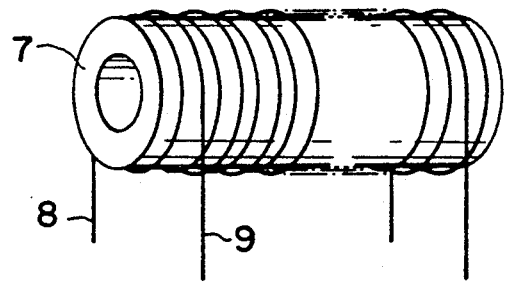
FIG. 2 is a perspective view showing the winding state of two superconducting coils.

A first embodiment of a superconducting switch according to this invention shown in FIG. 1 will be initially described. A hollow glass tube 7 is used as a core for winding a superconducting wire thereon. As shown in FIG. 2, a first superconducting coil 8 is wound from one side to the other side on the outer peripheral surface of the glass tube 7 so that it has a predetermined number of turns with a spacing between respective coil sections. Furthermore, a second superconducting coil 9 having the same number of turns as that of the first superconducting coil 8 is wound in a manner that it overlaps with the first superconducting coil 9 in a direction opposite to the winding direction of the first superconducting coil 8. This is a sort of non-inductive winding adapted to produce no electromagnetic induction, and which is known as a so-called AP (Ayrton Perry) winding. A superconducting coil body 10 is thus formed. Insulating caps 14 each consisting of an insertion portion 11 and a large diameter portion 12, and having a clamping or locking hole 13 are fitted into opening portions of both ends of the glass tube 7, respectively. Terminal plates 15 are put between the large diameter portions 12 and both end surfaces of glass tube 7, respectively. Furthermore, terminal pieces 16 are secured on the opposite sides of the terminal plate 15 in a manner that both ends of the glass tube 7 are fitted into the terminal pieces 16, respectively. The terminal piece 16 may be an annular member surrounding the glass tube 7, or may be a member holding a plurality of portions of the outer peripheral surfaces of the glass tube 7. Respective both ends of the first and second superconducting coils 8 and 9 are secured in parallel to the terminal pieces 16 and electrically conducts to the terminal plate 15. Bushings 17 are inserted into the clamping holes 13 of the respective insulating caps 14. A clamping bolt 18 is inserted from one insulating cap 14 toward the other insulating cap 14 through these bushings 17. The both end portions of the clamping bolt 18 projecting from respective insulating caps are clamped by nuts through fitting plates 19 put between the insulating caps 14 and the nuts 20, respectively. One fitting plate 19 and the insulating cap 14 are secured by a fitting pin 21 so that the superconducting body 10 rotates about the clamping bolt 18. It is to be noted that since the first and second superconducting coils 8 and 9 consist of the same material and have the same diameter, they have the same critical current value. In addition, the first and second superconducting coils 8 and 9 may be in contact with each other, or spaced from each other.

Figure 3:
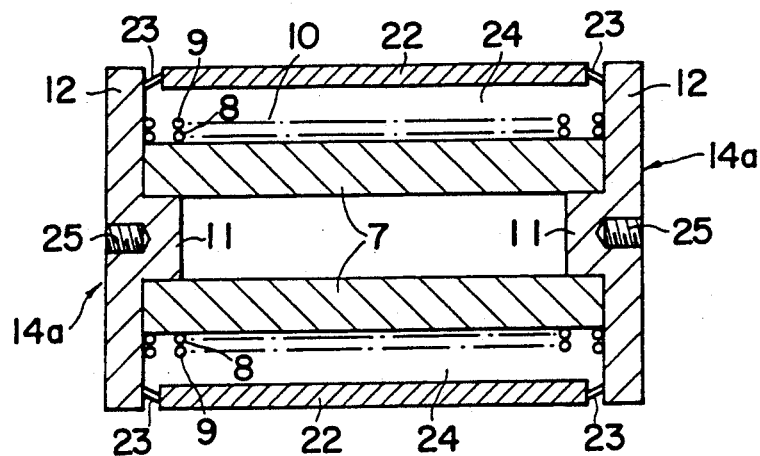
FIG. 3 is a cross sectional view showing the structure of a second embodiment of a superconducting switch according to this invention.

Referring to FIG. 3, there is shown in a second embodiment of a superconducting switch according to this invention. Since this current limiter 6 is of the same structure as that of the embodiment which has been described with reference to FIG. 1, those corresponding portions are respectively designated by the same reference numerals and their detailed explanation will be omitted. In the case of this embodiment, a conductor cap 14a is used in place of the insulating cap which has been described in the first embodiment of this invention. The conductor cap 14a includes large diameter portions 40 formed so that they are larger than the outer diameter of the superconducting coil body 10, and insertion portions 11 inserted into the both opening portions of the glass tube 7. An outer peripheral wall member 22 is provided between opposite two large diameter portions 12 in a manner that it is spaced from the outer peripheral portion of the superconducting coil body 10. Sealing members 23 such as silver brazing material are hermetically fitted annularly into respective portions between the end surfaces of the outer peripheral walls 22 and the large diameter portions 12. Thus, a vacuum chamber 24 is formed between the outer peripheral surface of the superconducting coil body 10 and the outer peripheral wall member 22. Respective both ends of the first and second superconducting coils 8 and 9 are secured in parallel to the conductor cap 14a. The reason why the sealing member 23 and the outer peripheral wall 22 are formed to have different thicknesses is that displacements received by the sealing member 23 and the outer peripheral wall 22 are caused to be different from each other, thereby preventing breakage between the large diameter portion 12 and the outer peripheral wall 22. Screw holes are formed in the central portions of respective conductor caps 14a. The other conductor may be screw-connected to the screw hole 25.

An example of the operation serving as a current limiter using the superconducting switch constructed above will be described with reference to FIGS. 4 to 7.

Figure 4:
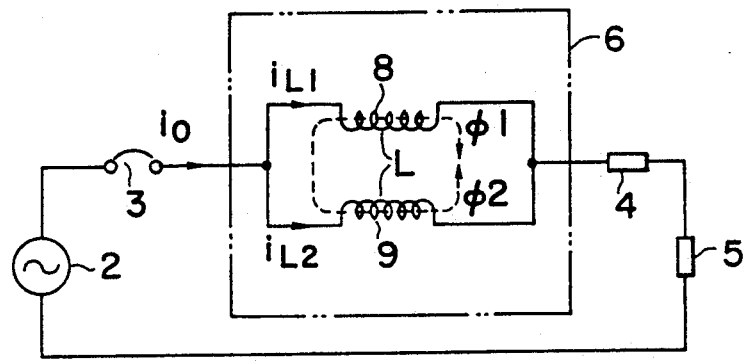
FIG. 4 is a circuit diagram for explaining the operation in the first and second embodiments of this invention.

As shown in FIG. 4, superconducting switch 6 is serially connected to the succeeding stage of interrupter 3 of a series circuit including power supply 2, interrupter 3, line impedance, and load 5.

Figure 5:
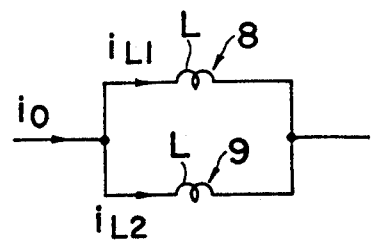
FIG. 5 is an equivalent circuit diagram at the time of a normal operation of the superconducting switch according to this invention.

When the circuit shown in FIG. 4 is normally operating, a predetermined current $i_o$ flows in load 5 through superconducting switching 6. This current $i_o$ is determined by a voltage E and an entire impedance Z. This entire impedance Z is sum of impedance $Z_{sc}$ of superconducting switch 6, a line impedance $Z_l$ and a load impedance $Z_L$. At this time, the superconducting switch 6 is in a superconducting state, and a current $i_o$ is a value in a range lower than a critical current $J_{cl}$. The current $i_o$ separately flows in the first and second superconducting coils 8 and 9 as currents $i_{L1}$ and $i_{L2}$, respectively. Since the first and second electroconducting coils 8 and 9 are the same in the number of turns and the quantity interleakage magnetic flux, and are wound so that they overlap with each other, the currents $i_{L1}$ and $i_{L2}$ take values approximate to each other. Magnetomotive forces having directions opposite to each other and of substantially the same strength are exerted on the first and second superconducting coils 8 and 9 on the basis of the currents $i_{L1}$ and $i_{L2}$, taking values approximate to each other. Magnetomotive forces having directions opposite to each other and substantially the same strength are exerted on the first and second superconducting coils 8 and 9 on the basis of the currents $i_{L1}$ and $i_{L2}$. As a result, two kinds of magnetic flux $\phi_1$ and $\phi_2$ having values nearly equal to each other are produced in accordance with these magnetomotive forces, respectively. Since respective magnetic flux $\phi_1$ and $\phi_2$ have directions opposite to each other, they cancel with each other, resulting in a noninductive state. Respective inductances of the first and second superconducting coils 8 and 9 are equal to an extremely small value of the order of leakage flux. Accordingly, when it is assumed that inductance due to leakage flux is designated by L as shown in FIG. 5, the resistance component is equal to zero and the reactance component is equal to a very small value of $\omega L/2$. As a result, the impedance is extremely small, resulting in no possibility that voltage drop occurs. The state at this time is labeled "normal operation" in FIGS. 7A and 7B. Namely, a current $i_o$ is determined by an impedance $Z_{sc}$ of the superconducting switch 6, a line impedance $Z_l$, and a load impedance $Z_L$ (not shown). This current $i_o$ is delivered to load 5 without undergoing a voltage drop by the first and second superconducting coils 8 and 9.

Figure 6:
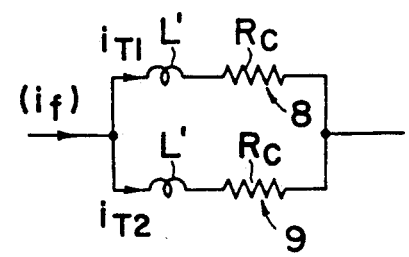
FIG. 6 is an equivalent circuit diagram at the time of quenching of the superconducting switch according to this invention.

The state produced when short-circuit is produced in the load 5 will be described in connection with the case of "quenching". When a short-circuit is produced in the circuit, an estimated short-circuit current $t_f$ given by $E/Z_1$ is going to flow. However, the moment a short circuit exceeds a critical current $J_{cl}$, the first and second superconducting coils 8 and 9 are brought into the quenching state. Namely, the first and second superconducting coils 8 and 9 are brought into a normal conductive state, and respective resistance values of the first and second superconducting coils 8 and 9 are rapidly increased to a resistance value Rc. This resistance value Rc is a value proportional to the product of the intrinsic resistance $\rho$ ($\mu\Omega$-cm) and the length l (cm) of the first and second superconducting coils 8 and 9, and is inversely proportional to cross section A (cm$^2$). When the resistance is rapidly increased to the resistance value Rc, the impedance $Z'_{sc}$ of the current limiter is increased. The equivalent circuit in this state is shown in FIG. 6. In this equivalent circuit, the impedance values $Z_{sc}'$ of the first and second superconducting coils 8 and 9 become equal to an extremely large value expressed $\sqrt{(\omega L')^2 + Rc^2}/2$ depending upon the respective resistance values Rc which have been rapidly increased. At this time, currents flowing in the first and second superconducting coils 8 and 9 by the increased resistance values Rc are limited to a value nearly equal to a critical current $J_{cl}$ as indicated by currents $i_{T1}$ and $i_{T2}$ in FIG. 7A. It is to be noted that when the short-circuit current $i_f$ separately flows in the first and second superconducting coils 8 and 9, quantities of respective flux cancel with each other, and the inductance L' is based on a small leakage magnetic flux produced at this time. Accordingly, the inductance L' becomes equal to an extremely small value, so the time constant becomes extremely small. Thus, currents flowing in the first and second superconducting coils 8 and 9 can be limited to currents $i_{T1}$ and $i_{T2}$ by the rapidly increased resistance values Rc without time delay, respectively.

In the case of the superconducting switch 6 of this invention shown in FIG. 3, the first and second superconducting coils 8 and 9 are kept in a vacuum state. When quenching occurs, liquid helium becomes gaseous due to the heat produced. As a result, the insulating withstand voltage value is lowered and a light voltage is applied to the first and second superconducting coils 8 and 9. In this instance, since the first and second superconducting coils 8 and 9 are in a vacuum, a withstand voltage value against a high voltage is higher than that when quenching is produced in air.

The superconducting switch 6 constructed as above can freely select impedance $Z_{sc}'$ and currents $i_{T1}$ and $i_{T2}$ at the time of quenching by selecting material, number of turns, and wire diameter of the first and second superconducting coils 8 and 9. Thus, this switch 6 can limit a current over a broad range. In addition, since the inductance L can be extremely small and the impedance $Z_{sc}$ set over a broad range at the time of normal operation, a contactless switch can be realized.

It is to be noted that while glass tube 7 is used as the insulating core in the above-mentioned both embodiments, other insulating materials having heat-resisting property may be used for this purpose.

It is further to be noted that the superconducting switch of this invention can be widely applied not only as a current limiter, but also as a switch of which state changes by an increase in current.

Figure 8:
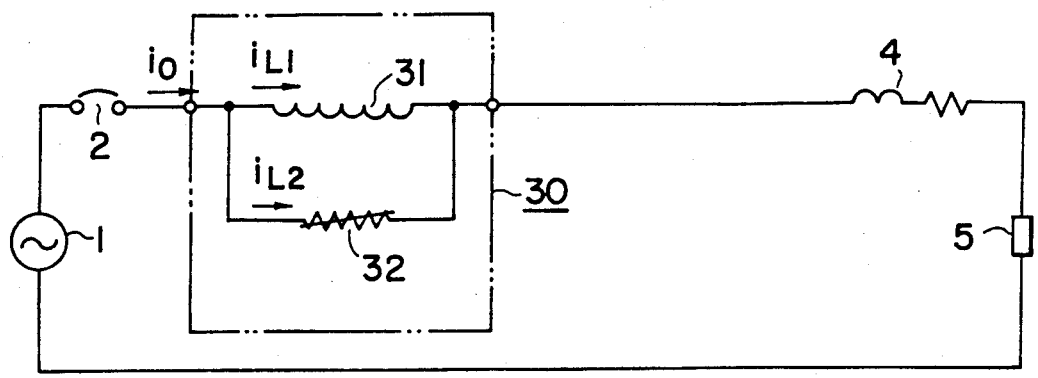
FIG. 8 is a circuit diagram of a first embodiment of a current limiter according to this invention.

FIG. 8 is a circuit diagram showing the configuration of a first embodiment of a current limiter according to this invention in conjunction with its application. Referring to this figure, an interrupter 2, a current limiter 30, and a line impedance 4 are inserted into one line as an electric path connecting an a.c. power source 1 and a load. In this embodiment, the current limiter 30 comprises a superconducting coil 31 wound so as to have an inductance sufficient to suppress a current in the line to a value lower than a limit value and a superconducting switch 32 connected in parallel with the superconducting coil 31, wherein the superconducting switch 32 includes two coils subjected to non-inductive AP winding so that quantities of flux produced by these coils cancel each other to provide substantially zero inductance, and has a critical current value smaller than that of the superconducting coil 31.

Figure 9:
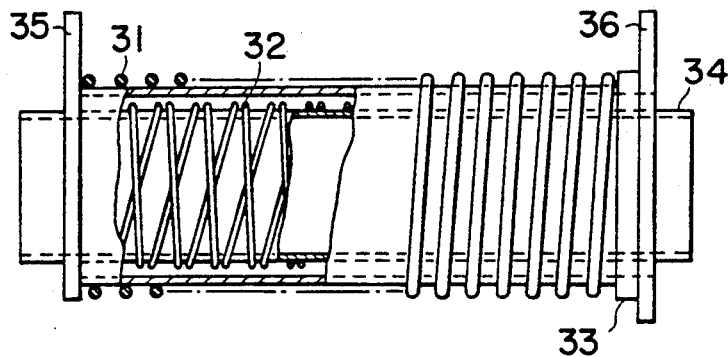
FIG. 9 is a front view partially cut showing the structure of a first embodiment of current limiter according to this invention.

FIG. 9 is a schematic view showing an actual configuration of the superconducting coil 31 and the superconducting switch 32. The superconducting coil 31 is wound on a bobbin 33, and the coils of the superconducting switch 32 are wound on a bobbin 34 disposed in a hollow portion of the bobbin 33. Accordingly, the superconducting switch 31 wound on the common core within a magnetic field produced by the superconducting coil 31. Respective coil ends are connected commonly to the terminals 35 and 36.

The operation of this embodiment constructed above will be described.

Figure 10:
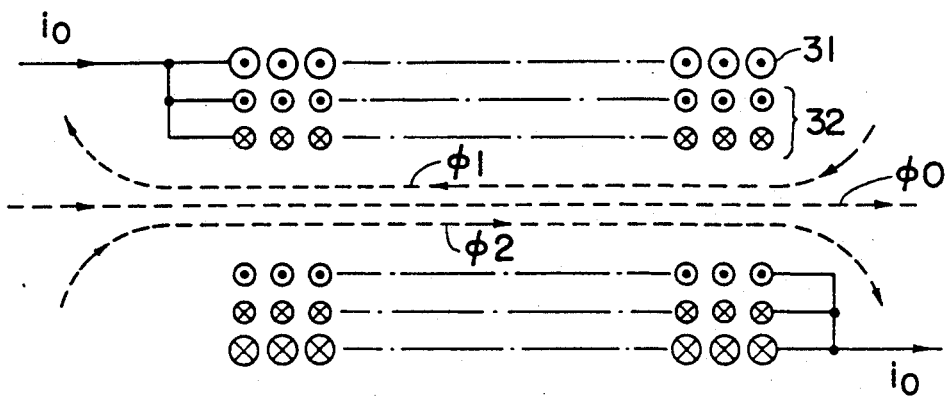
FIG. 10 is a model view showing a connection of the current limiting coil and the superconducting switch in the current limiter according to this invention.

When the superconducting coil 31 and the superconducting switch 32 are both in a superconducting state, the superconducting coil 31 exhibits a relatively large impedance by its inductance with respect to a current flowing in the line, whereas the superconducting switch 32 exhibits substantially zero impedance because it is non-inductive. FIG. 10 is a model view for explaining the above phenomenon. Assuming that a current $i_o$ in a direction indicated by an arrow flows in the superconducting coil 31 and the superconducting switch 32, magnetic flux $\phi_o$ is produced by the superconducting coil 31 to have an impedance corresponding to the inductance. In contrast, quantities of magnetic flux $\phi_1$ and $\phi_2$ produced by the AP-wound coils of the superconducting switch 32 cancel each other, so that impedance becomes substantially equal to zero.

Assuming that there is no failure on the load 5 side and a current $i_o$ having an ordinary amplitude flows in the load 5, when a current flowing in the superconducting coil 31 and a current flowing in the superconducting switch 32 are designated by $i_{L1}$ and $i_{L2}$, respectively, the following relationship holds:

$$i_o = i_{L1} + i_{L2} \quad (1)$$

$$i_{L1} < i_{L2} \quad (2)$$

Accordingly, most of the current $i_o$ in the line flows into the superconducting switch 32. In addition, because the resistance value is equal to zero, a voltage drop produced by flowing of the current $i_o$ is equal to substantially zero.

When an overcurrent flows in the line due to short circuit failure, etc. of the load 5 and the value thereof exceeds above a critical current value $J_{cl}$ of the superconducting switch 32, the superconducting switch 32 is momentarily quenched, resulting a resistor having an extremely large resistance. As a result, most of the current which has flowed in the superconducting switch 32 communicates into the superconducting coil 32.

Both currents have a relationship expressed as the following equation:

$$i_{L1} < i_{L2} \quad (3)$$

Accordingly, the line current is limited to a limit value by the inductance of the superconducting coil 31. In this case, since a current $i_{L2}$ flowing in the superconducting switch 32 is extremely small, a power loss dissipated as heat is suppressed to an extremely small value.

Figure 11A:
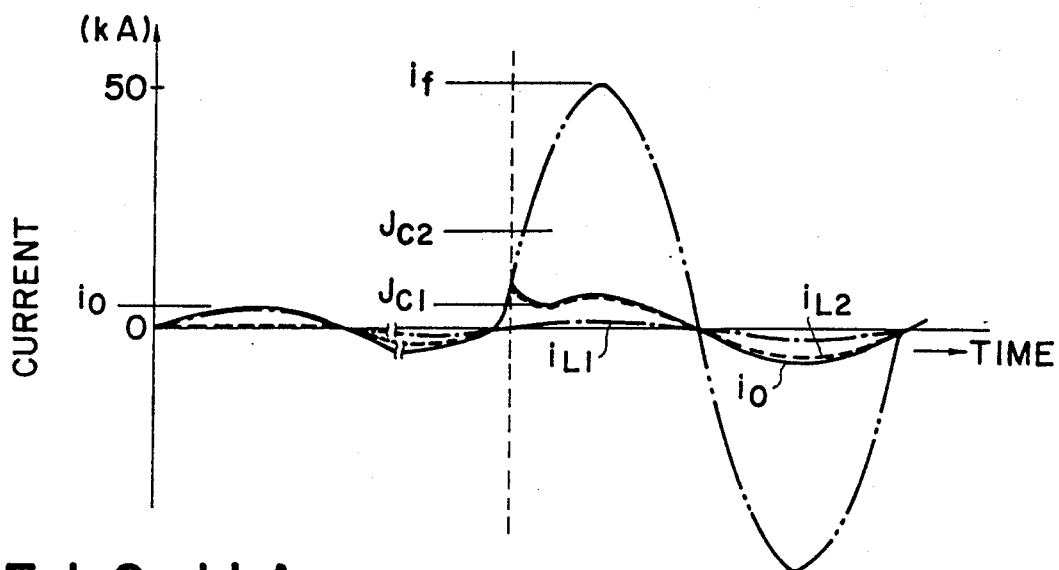
FIG. 11A is a graph showing current changes at the time of normal operation and at the time of quenching operation of the current limiter according to this invention.
Figure 11B:
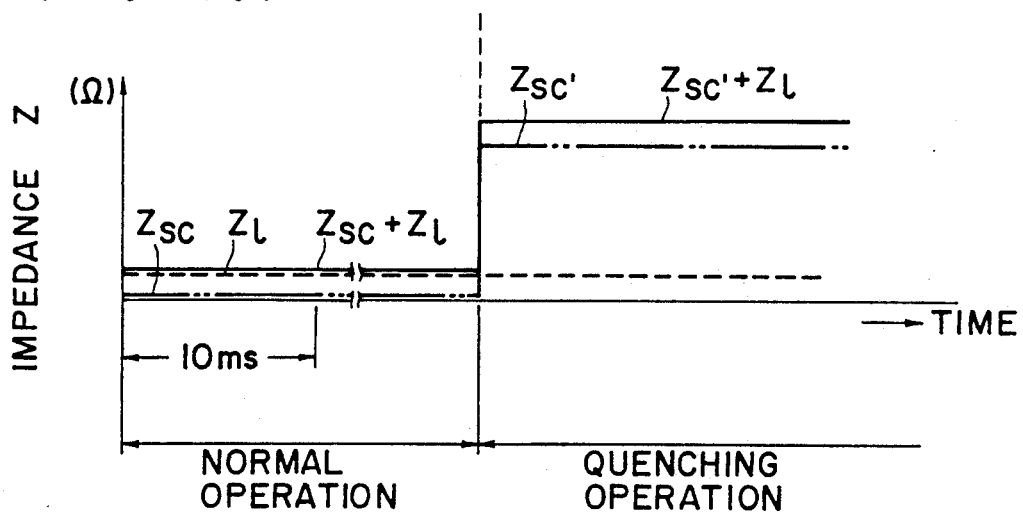
FIG. 11B is a graph showing impedance changes at the time of normal operation and at the time of quenching operation of the current limiter according to this invention.

FIGS. 11A and 11B show how the current i and the impedance $Z_{sc}$ of the current limiter vary at the time of normal operation and at the time of current limiting operation. Namely, at the time of normal operation, the impedance $Z_{sc}$ of the current limiter 30 is extremely small, so the current $i_o$ in the line is kept normal mainly by the impedance Z of the load. On the other hand, when a short-circuit occurs in the load, an estimated short-circuit current $i_f$ attempts to flow in the line.

However, the moment the line current exceeds the critical current value $J_{cl}$ of the superconducting switch 32, the impedance of the current limiter is increased as described above, so the short-circuit current is limited to a current value $i_{L2}$ lower than a limit value.

In this case, the critical current value $J_{c2}$ of the superconducting coil 31 is set to a value larger than the current limit value of the line. Furthermore, the current limiter 30 is cooled by interrupting the line by the interrupter 2, thus readily returning to a steady state.

Since two superconducting coils are disposed using the core common thereto in the above-described embodiment, the current limiter becomes considerably compact and is easily held in a superconducting state. However, even if these superconducting coils are disposed away from each other, the above-described current limiting operation can be performed.

As just described above, in accordance with this embodiment, superconducting coils are employed and such superconducting coils are arranged using the core common to the both coils. Thus, simplified construction and miniaturization of the current limiter are realized, and high speed response and reliable line protection can be performed.

Figure 12:
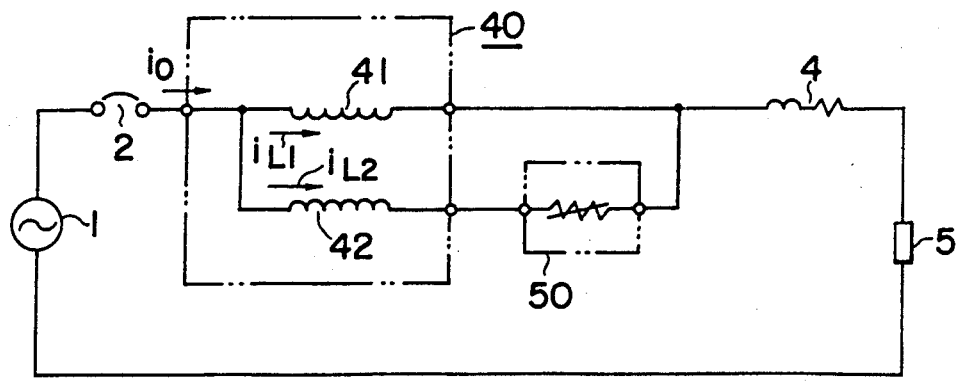
FIG. 12 is a circuit diagram showing a second embodiment of a current limiter according to this invention.

FIG. 12 is a circuit diagram showing the configuration of a second embodiment of a current limiter according to this invention in conjunction with its application. Referring to this figure, an interrupter 2, a current limiter comprising a superconducting reactor 40 and a superconducting switch 50, and a line impedance 4 are inserted into one line as an electric path connecting an a.c. power source 1 and a load 5. In this embodiment, the superconducting reactor 40 has an inductance to suppress a current in the line to a value lower than a limit value. The superconducting reactor 40 is composed of a superconducting coil 41 having a critical current value larger than a current limit value, and a superconducting coil 42 wound on the same bobbin of that of the superconducting coil 41. When this coil 42 is inserted in parallel into the line, it produces the same magnitude of magnetomotive force as that of the coil 41. Thus, quantities of magnetic flux produced by these coils 41 and 42 cancel each other. When currents $i_{L1}$ and $i_{L2}$ flow into these coils, respectively, their impedance values becomes substantially equal to zero. On the other hand, the superconducting switch 50 is constructed as a superconducting coil wound non-inductively and is serially connected to the superconducting coil 42.

Figure 13:
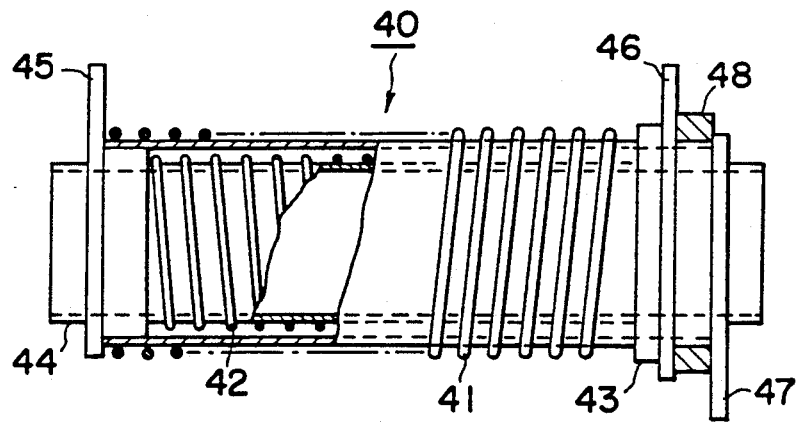
FIG. 13 is a front view partially cut showing the structure of a current limiting coil in the second embodiment of the current limiter according to this invention.

FIG. 13 is a schematic view showing an actual configuration of the superconducting reactor 40. The superconducting coil 41 and the superconducting coil 42 are wound on the bobbins 43 and 44, respectively. Furthermore, the superconducting coil 42 is wound on the common core inside superconducting coil 41. Respective one ends of both coils are connected in common to a terminal 45. The other end of the superconducting coil 42 and the other end of the superconducting coil 42 are connected to terminals 46 and 47, respectively. In addition, reference numeral 48 denotes a spacer for holding insulating material between the terminals 46 and 47 of these superconducting coils.

Figure 14:
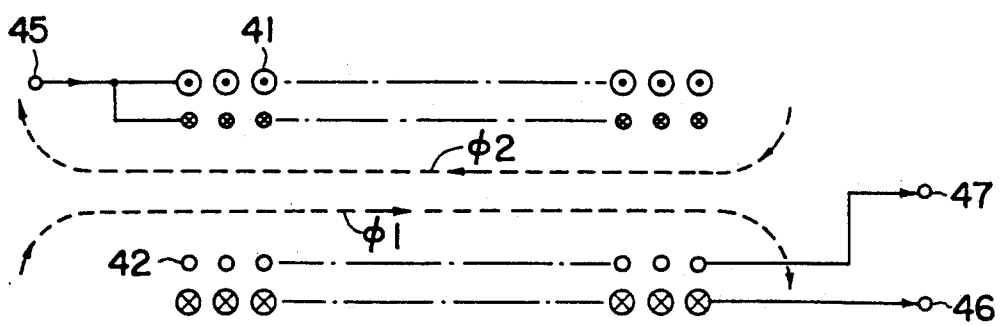
FIG. 14 is a model view showing the coil connection thereof.

FIG. 14 is a view showing the internal connection and behavior of magnetic flux of the superconducting reactor 50. There is provided an arrangement such that when the superconducting coils 41 and 42 are connected in parallel with the line, magnetic flux $\phi_1$ produced on the superconducting coil 41 and magnetic flux $\phi_1$ produced on the superconducting coil 42 cancel each other.

Figure 15:
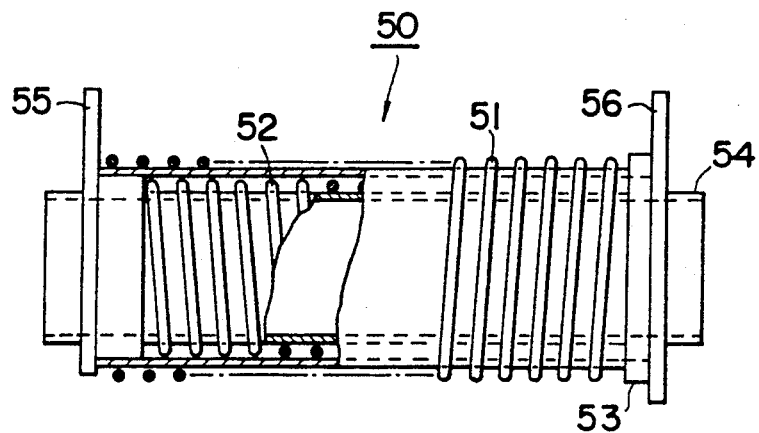
FIG. 15 is a front view partially cut showing the structure of the superconducting switch in the second embodiment of the current limiter according to this invention.

FIG. 15 is a view showing an actual configuration of the superconducting switch 50. This switch 50 is composed of superconducting coils 51 and 52. The superconducting coils 51 and 52 are wound on bobbins 53 and 54, respectively. In addition, the superconducting coil 52 is concentrically disposed inside the superconducting coil 51. One end of each of the respective coils are connected in common to a terminal 55, and the other ends thereof are connected commonly to a terminal 56.

Figure 16:
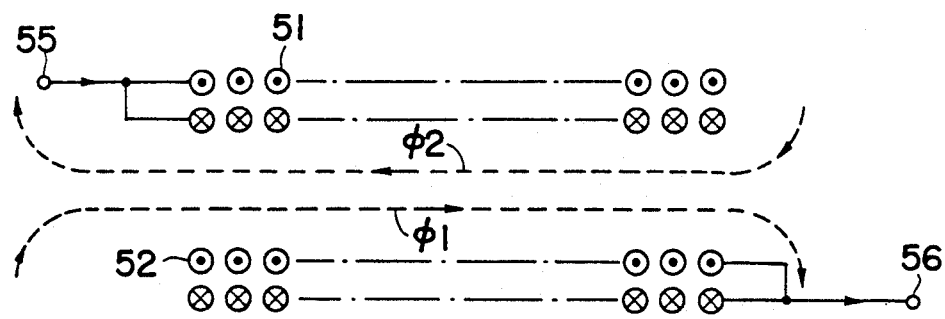
FIG. 16 is a model view showing the coil connection thereof.

FIG. 16 shows a diagram showing the internal connection and the behavior of magnetic flux of the superconducting switch 50. When a current is caused to flow between terminals 55 and 56, this current flows separately into respective coils, so magnetic flux $\phi_1$ produced on the superconducting coil 51 and magnetic flux $\phi_2$ produced on the superconducting coil 52 cancel with each other.

The superconducting coils 41 and 42 constituting the superconducting reactor are made up so that their critical current values are larger than the current limit value of the line. Furthermore, the superconducting switch is made up so that it is quenched in correspondence with the increase in the current in the superconducting coil 52 when there overcurrent in the line.

The operation of the second embodiment constructed above will be described with reference to FIG. 10 as well.

When a current $i_o$ flowing in the line is in a normal state, both the superconducting reactor 40 and the superconducting switch 50 are held in a superconducting state. Thus, the resistance values of the superconducting coils 51 and 52 constituting the superconducting switch 50 are equal to zero and are in a non-inductive state. Accordingly, the current $i_o$ branches into the superconducting coils 41 and 42 constituting the superconducting reactor 40 to flow as currents $i_{L1}$ and $i_{L2}$ in these coils, respectively. The respective magnetic flux produced thereby cancel with each other. These coils 41 and 42 have a mutual inductance $-M$, but the values of self-inductance $L_1$ and $L_2$ are kept at a value to have no influence on such currents.

Figure 17A:
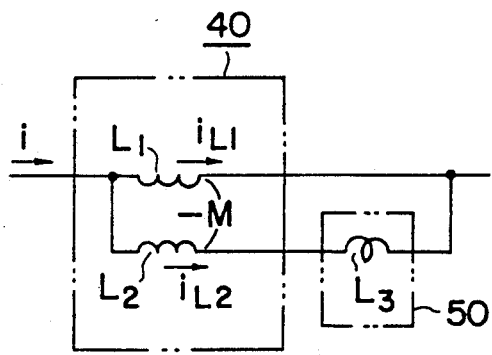
FIG. 17A is an equivalent circuit diagram showing a normal state operation in the second embodiment of the current limiter according to this invention.

FIG. 17A is an equivalent circuit thereof. The superconducting switch 50 functions as an element having only a very small leakage inductance. Furthermore, the superconducting reactor 40 functions as an element having only a mutual inductance $-M$.

Figure 17B:
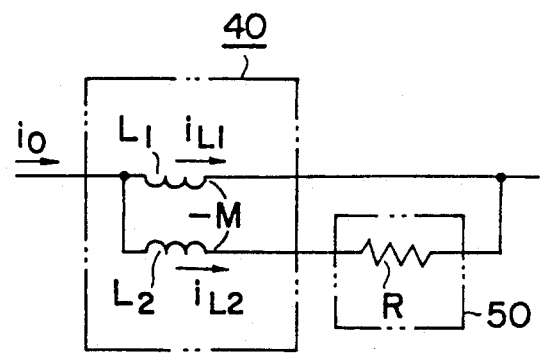
FIG. 17B is an equivalent circuit diagram showing the current limiting operation in the second embodiment of the current limiter according to this invention.

When an estimated short-circuit current $i_f$ determined by a power supply voltage E and a line impedance $Z_1$ attempts to flow as a result of the fact that a failure such as a load short-circuit occurs, a current flowing in the superconducting switch 50 also increases according as the above current $i_f$ increases. The superconducting coils 41 and 42 constituting the superconducting switch 50 have a critical current value $J_{cl}$ corresponding to current values being increasing of these coils 41 and 42. At the same time when a current $i_{L2}$ flowing in the superconducting coil 41 exceeds above this current value $J_{cl}$, it is quenched, so a current $i_{L2}$ which has flowed in the superconducting coil 42 communicates into the superconducting coil 41. As a result, most of a current flowing in the line flows into the superconducting coil 41. Accordingly, the superconducting reactor 40 will have a large inductance by magnetic flux $\phi_1$ produced by the superconducting coil 41. FIG. 17B shows an equivalent circuit in such a case. The superconducting switch 50 changes to an element having an extremely large value R, and the line current $i_o$ is limited by the self-inductance of the superconducting coil 41.

As just described above, the current limiting circuit according to the second embodiment is constructed so that its impedance is equal to substantially zero with respect to a normal line current, and it functions as a reactor with respect to an overcurrent, therefore to limit a line current.

FIGS. 18A and 18B show how the current $i_o$ and the impedance $Z_{sc}$ of the current limiter vary at the time of normal operation and at the time of current limiting operation. Namely, at the time of normal operation, the impedance $Z_{sc}$ of the current limiter is extremely small, so that the line current $i_o$ is kept normal mainly by the load impedance $Z_l$. In contrast, when a load short circuit occurs, an estimated short-circuit current $I_f$ attempts to flow in the line. However, when the line current increases to a value of $J_g$, the current flowing in the superconducting switch 50 exceeds above the critical current value $J_{cl}$. At this moment, the impedance of the superconducting reactor 40 increases to a value $Z'_{sc}$. As a result, the short-circuit current is limited to a value lower than a limit value.

As just described above, also in accordance with this embodiment, superconducting coils are employed and such superconducting coils are arranged using the core common to both the coils. Thus, simplified construction and miniaturization of the current limiter are realized, and high speed response and reliable line protection can be performed.

What is claimed is:

1. A superconducting switch comprising:
   cylindrical core means;
   a first superconducting coil wound on the outer peripheral surface of said core means from one side thereof to the other side thereof, and having a first critical current value, wherein when a current above said critical current value flows, the resistance value of said first superconducting coil changes to a first high resistance value in a normal conducting state;
   a second superconducting coil wound on the outer peripheral surface of said core means from one side thereof to the other side thereof so as to overlap with said first superconducting coil, and having substantially the same critical current value as that of said first superconducting coil, wherein when a current above said critical current value flows, the resistance value of said second superconducting coil changes to a second high resistance value in a normal conducting state; and
   connection means for connecting in parallel said first and second superconducting coils so as to produce magnetomotive forces which are the same in magnitude and are opposite to each other in direction;
   said superconducting switch being connected in series with a load in an electric path, wherein when an overcurrent above said critical current value flows in said electric path, said superconducting switch is quenched, so the resistance value thereof changes to resultant resistance value of said first and second high resistance values as a whole;
   wherein said first and second superconducting coils have winding directions opposite to each other, said connection means being a set of terminal plates commonly connecting respective ends of said first and second superconducting coils on one side of said core means and on the other side thereof, respectively.

2. A superconducting switch as set forth in claim 1, which further comprises a vacuum chamber formed so as to surround said first and second superconducting coils.

3. A superconducting switch as set forth in claim 2, wherein said vacuum chamber is formed by said terminal plates formed projectedly from the surfaces of said first and second superconducting coils, and an outer peripheral wall member connecting peripheral edge portions of said opposite terminal plates.

4. A current limiter comprising:
   cylindrical core means;
   a first superconducting coil wound on the outer peripheral surface of said core means from one side thereof to the other side thereof, and having a first critical current value, wherein when a current above said critical current value flows, the resistance value of said first superconducting coil changes to a first high resistance value in a normal conducting state;
   switch means formed non-inductively and disposed within a magnetic field produced by said first superconducting coil, and having a second critical current value corresponding to an overcurrent value smaller than said first critical current value, wherein when a current above said second critical current value flows, said switch means changes to a normal conducting state; and
   connection means for connecting in parallel said first superconducting coil and said switch means;
   said current limiter being connected in series with a load in an electric path, wherein when an overcurrent above said second critical current value flows in said electric path, said current limiter is operative to limit said overcurrent;
   wherein said switch means is a second superconducting coil composed of two coils wound in direction opposite to each other and commonly connected at both ends thereof.

5. A current limiter as set forth in claim 4, wherein said first superconducting coil is wound on the outer peripheral surface of second cylindrical core means inserted into the hollow portion of said core means.

6. A current limiter comprising:
   cylindrical core means;
   a first superconducting coil wound on the outer peripheral surface of said core means from one side thereof to the other side thereof, and having a first critical current value, wherein when a current above said critical current value flows, the resistance value of said first superconducting coil changes to a first high resistance value in a normal conducting state;
   a second superconducting coil wound in relation to said first superconducting coil, and having the same magnetomotive force as that of said first superconducting coil;
   connection means for connecting in parallel said first and second superconducting coils so as to produce electromotive forces in directions opposite to each other; and
   switch means non-inductively formed and disposed within a magnetic field produced by said first superconducting coil, and having a second critical current value corresponding to an overcurrent value smaller than said first critical current value, wherein when a current above said second critical current value flows, said switch means changes to a normal conducting state;

said current limiter being connected in series with a load in an electric path, wherein when an overcurrent above said second critical current value flows in said electric path, said current limiter is operative to limit said overcurrent;

wherein said switch means is comprised of third and fourth superconducting coils wound in directions opposite to each other and commonly connected at both ends thereof.

* * * * *